United States Patent [19]

Waite

[11] 4,072,817

[45] Feb. 7, 1978

[54] METHOD OF MAKING SEMI-CONDUCTOR MOUNTS

[75] Inventor: John Stuart Waite, Powys, England

[73] Assignee: GKN Floform Limited, Powys, Great Britain

[21] Appl. No.: 752,290

[22] Filed: Dec. 20, 1976

[30] Foreign Application Priority Data

Jan. 8, 1976 United Kingdom ............... 597/76

[51] Int. Cl.² ............................................. H05K 5/00
[52] U.S. Cl. ............................. 174/52 H; 29/588; 29/589; 29/591; 29/628; 29/630 C; 219/118; 228/173 A; 228/155; 228/178; 357/81
[58] Field of Search ............ 29/628, DIG. 47, 630 R, 29/591, 592, 589, 590, 580, 576 C, 576 R, 581, 588, 630 C; 228/173 R, 173 A, 155, 178, 123, 212; 219/118, 117 R, 85 E, 85 BA, 85 BM, 158; 357/81; 174/52 H

[56] References Cited

U.S. PATENT DOCUMENTS

| | | | |
|---|---|---|---|
| 1,181,741 | 5/1916 | Coolidge | 29/630 C X |
| 1,469,043 | 9/1923 | Laise et al. | 219/85 E X |
| 2,049,771 | 8/1936 | Gwyn, Jr. | 29/630 C |
| 2,199,240 | 4/1940 | Gwyn, Jr. | 29/630 C X |
| 3,089,067 | 5/1963 | Baird | 29/589 |
| 3,176,382 | 4/1965 | Dickson, Jr. et al. | 29/588 |
| 3,197,843 | 8/1965 | Nippert | 29/591 X |
| 3,197,857 | 8/1965 | Nippert | 29/630 C |
| 3,279,039 | 10/1966 | Nippert | 29/591 |
| 3,893,226 | 7/1975 | Waite | 228/173 A X |

*Primary Examiner*—Victor A. DiPalma
*Attorney, Agent, or Firm*—Parmelee, Miller, Welsh & Kratz

[57] ABSTRACT

A method of making a mount for a solid state semi-conductor comprising a mounting part secured to a body element comprising the steps of positioning a mounting part in contact with a body element, applying heat to the body element in the region of the inter-face between the body element and the mounting part by conduction from the mounting part for a time and at a temperature to cause melting of the body element in the region of the inter-face and consequently to cause bonding of the mounting part to the body element.

13 Claims, 6 Drawing Figures

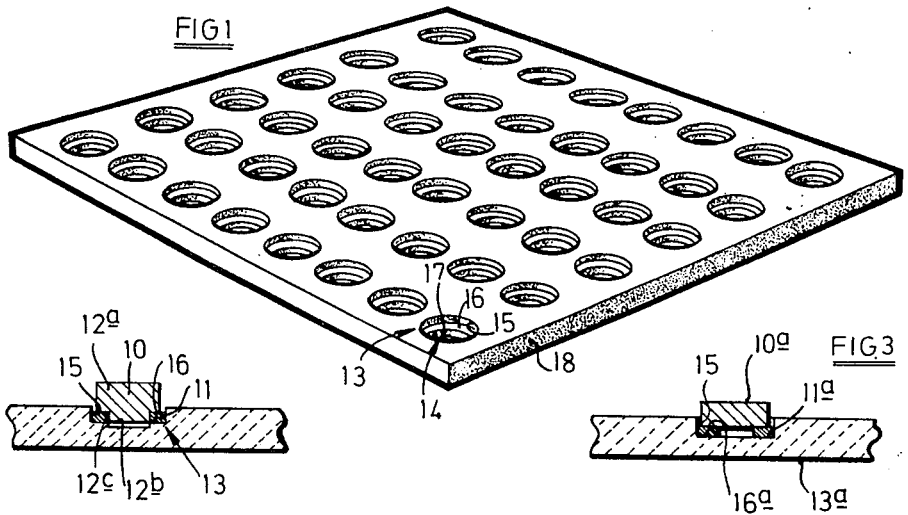
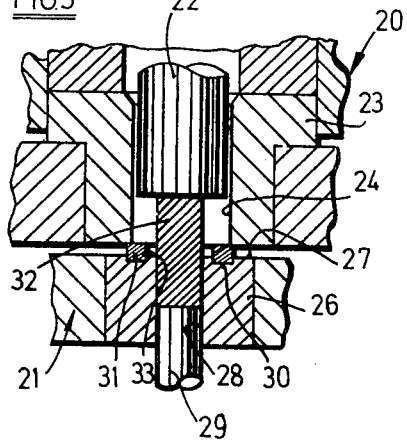
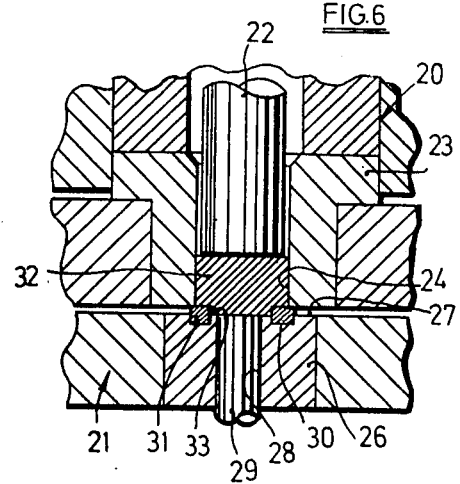
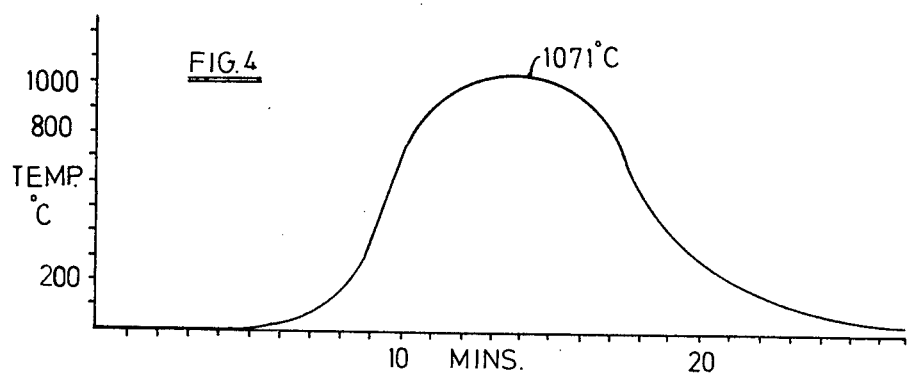

METHOD OF MAKING SEMI-CONDUCTOR MOUNTS

BACKGROUND OF THE INVENTION

1. Field of the Invention

This invention relates to a method of making a mount for a solid state semi-conductor.

A mount for a solid state semi-conductor is usually in one of two forms namely a cup type mount or a stud type mount.

A cup type mount may comprise a cup shape body, usually made of copper or an alloy thereof, and having a mounting part in the form of a ring and usually made of steel, secured to the rim of the cup shape body. An alternative form of cup type mount may comprise a disc shaped body, made of copper, or an alloy thereof, and having a mounting part in the form of an eyelet and usually made of steel, secured to the circumferential side wall of the body.

In both cases the mounting part is used for mounting a cover on the mount after the semi-conductor has been mounted on the body.

A stud type mount comprises a body in the form of a shank, usually threaded and usually made of copper or an alloy thereof, and formed integrally with an enlarged head at one end upon which the semi-conductor may be mounted. A mounting part, usually in the form of a ring and usually of steel, is secured to the body, again for the mounting of a cover on the mount after the semi-conductor has been mounted on the body.

2. Description of the Prior Art

Hitherto one way in which such semi-conductor mounts have been made is disclosed in U.K. Pat. No. 922,823 and comprises positioning a mounting part on a blank of copper or an alloy thereof with a ring of brazing alloy interposed between the mounting part and the blank, followed by heating of the assembly to cause the brazing alloy to fuse and secure the mounting part to the body and then forming the body to the desired final shape by forging the blank between press tools. Usually the blank has been pre-formed from stock bar rod to a suitable shape for subsequent forging to make the body.

This method has the disadvantage that the brazing alloy, which is usually a silver brazing alloy, is relatively expensive. In addition, it is necessary to position the brazing alloy and mounting part on the blank and fuse the brazing alloy by passing the assembled components through a suitable furnace before forging of the blank to make the body and this is a time consuming and labour intensive operation, thereby increasing the cost of manufacture of the semi-conductor mount.

Another way in which such semi-conductor mounts have been made is disclosed in U.K. Pat. No. 1,352,317 (corresponding to U.S. Pat. No. 3,893,226) and comprises positioning a blank adjacent a mounting part of a cover, applying pressure to the blank and mounting part to press them together and to cause plastic deformation of the blank and relative movement between the parts of the surfaces of the blank and the mounting part which are in contact, followed by heating of said blank and mounting part thereon to cause bonding between said parts of said surfaces and then mounting the semi-conductor on the body and mounting the cover on the mounting part.

The plastic deformation and relative movement causes a surface layer of the parts of the surface which are in contact to be removed to clean the surfaces so that bonding between the surfaces occurs as a result of diffusion of atoms between the surfaces, when the mount is heated.

In this method it has been found that there sometimes occurs voids in the joined area which could trap plating solutions and therefore it is not completely satisfactory in all cases.

SUMMARY OF THE INVENTION

An object of the present invention is to provide a new and improved method of making a solid state semi-conductor mount which avoids or reduces the abovementioned disadvantages of the existing methods.

According to the present invention we provide a method of making a mount for a solid state semi-conductor comprising the steps of positioning a mounting part in contact with a body element, applying heat to the body element in the region of the interface between the body element and the mounting part by conduction from the mounting part, for a time and at a temperature to cause melting of the body element in the region of the interface and consequently to cause bonding of the mounting part to the body element.

Preferably the mounting part is positioned in contact with the body element in a jig, the jig engaging the mounting part and having good thermal conductivity and the jig being subjected to a temperature for a time to cause said melting and consequent bonding as a result of conduction of heat from the jig through the mounting part to the body element.

Preferably the jig is adapted to engage the body element to constrain deformation of the body element on the application of said heat.

Subsequently the assembly may be cold formed to a final desired shape and the semi-conductor may be mounted on the body and then a cover on the mounting part.

The mounting part may be positioned in contact with the body element by forming a spigot on the body element and assembling a ring shaped mounting part onto the spigot in the jig or by positioning a blank for the body element adjacent to an opening in an annular mounting part, applying pressure to the blank to cause plastic deformation thereof to form the blank to a body element of predetermined configuration said deformation including radially outward movement of part of the blank to bring the blank into contact with a planar surface of the surrounding mounting part, continuing the pressure against the blank and exerting pressure against the mounting part, the pressure being sufficient to shear off surface portions of the blank and mounting part thereby exposing new uncontaminated surfaces in contact with each other; or by assembling the body element and mounting part in face to face contact in the jig.

If desired the body element may be in the form of a blank which is formed to a desired final configuration by a cold forming operation subsequent to bonding of the body element and mounting part.

Alternatively the body element may comprise a body of the desired final configuration.

The interface may be maintained at a temperature not less than the melting point of the body element for approximately one minute.

The jig may be made of any desired material having sufficiently good thermal conductivity such as graphite.

The jig may be heated in a furnace such as an electric muffle.

Alternatively the jig may itself be provided with an integral heating means.

BRIEF DESCRIPTION OF THE DRAWINGS

The invention will now be described in more detail by way of example with reference to the accompanying drawings wherein:

FIG. 1 is a diagrammatic perspective view of a jig for use in a method embodying the invention.

FIG. 2 is a cross sectional view, to an enlarged scale, of part of the jig of FIG. 1 illustrating one embodiment, and FIG. 3 is a view similar to that of FIG. 2 but illustrating an alternative embodiment of the invention.

FIG. 4 is a temperature/time graph

FIG. 5 is a cross sectional view showing one method of positioning the mounting part in contact with the body element, and FIG. 6 is a view similar to that of FIG. 5 but illustrating a later stage in the method.

DESCRIPTION OF THE PREFERRED EMBODIMENTS

Referring to the drawings and in particular to FIG. 2, in which there is illustrated a preform for a stud type mount. The preform comprises a body element 10 of copper and an annular steel mounting part 11. If desired the body element and mounting part may be made of other suitable material for example a suitable copper alloy in the case of the body element. The copper body element 10 is preformed to have a head 12a and a spigot 12b extending therefrom with a shoulder 12c therebetween. The steel mounting part 11 is assembled onto the spigot 12b, so as to engage the spigot 12b and the shoulder 12c, in a graphite jig 13. As best shown in FIG. 1 the jig 13 comprises a counterbored recess 14 having a larger diameter part 15 separated by a shoulder 16 from a smaller diameter part 17. A plurality of such recesses 14 are provided in a single block 18 of graphite. The spigot 12b is slightly spaced from the circumferential wall of the part 17, and the mounting part 11 engages the shoulder 16 and the circumferential wall of the part 15.

The graphite block or tray 18 with pre-assembled body elements and mounting parts is then introduced into an electric muffle furnace having a hydrogen, or other protective, atmosphere and the graphite block is subjected to a temperature of approximately 1100° C for a short period of time.

The graphite block is passed through the furnace on a furnace belt at a speed, in the present example, of 4 inches per minute and thus the graphite block is subjected to said temperature of 1100° C for a period of 5 minutes; the 1100° C zone of the furnace extending over approximately 20 inches.

FIG. 4 illustrates the variation with time of the temperature in the vicinity of an assembly on the graphite block as determined by a thermocouple placed at this location.

It will be seen that a temperature of approximately 1071° C is attained for approximately 2 minutes, during which it is of course essential that a temperature of at least equal to the melting point of copper is achieved for a short period of time, for example 1 minute, in order that the copper melts and wets the material of the mounting part, thereby leaving no voids and so ensuring a good bond. At the same time it is essential that this temperature is not held for too long or that too high a temperature is achieved otherwise the main bulk of the copper body element would not remain solid. Some slight amount of deformation of the main bulk of the body element can be allowed as this is restrained as a result of engagement with the smaller diameter part 17 of the jig.

Because copper has a relatively high thermal reflectivity and body element is not heated, in the time available, to its melting point as a result of radiant heating in a furnace. Instead, because the graphite jig has good thermal absorbtivity and good thermal conductivity the jig is relatively rapidly raised to a temperature in excess of the melting point of copper and this heat is transmitted by conduction from the jig to the mounting part which is in contact with the jig as explained hereinbefore and hence from the mounting part, which is of considerably higher melting point than the body element, to the body element thus giving localised heating to the body element in the region of the interface. Having achieved this localised melting effecting fusion bonding with the mounting part, cooling of the jigs is commenced immediately by appropriate control of the thermal profile of the furnace.

In an alternative embodiment, illustrated in FIG. 3, the body element is not provided with a pre-formed spigot and in this case the ring shaped steel mounting part is merely assembled in face to face relationship with the body element in a graphite jig 13a as indicated at 11a and 10a in FIG. 3. The mounting part 11a is in contact with a base part 16a and circumferential wall 15a of the jig 13a and, at least initially, the body element is maintained out of contact therewith.

In a further alternative shown in FIGS. 5 and 6 the body element is made in a conventional forging press comprising an upper die assembly 20 and a lower die assembly 21. The upper die assembly 20 is provided with a slidable conventional ejector member 22 which is caused to move downwardly by conventional means, not shown, when it is desired to eject an assembled body element and mounting part.

The upper die assembly 20 comprises an upper die 23 having a generally cylindrical die recess 24 therein.

The lower die assembly 21 likewise carries a lower die 26 having a generally planar upper face 27 and a central passage 28 within which a mandrel 29 is slidably mounted. An annular recess 30 of channel cross-section, is formed in the upper surface 27 around the passage 28.

In use, a ring shaped mounting part 31 is fed by conventional mechanical feeding means, not shown, so that it is positioned in the recess 30 whilst a generally cylindrical blank 32 of copper or a copper base alloy is fed so as to be positioned on the lower die 26 within the steel weld ring 31.

The upper die assembly 20 is then moved downwardly so that, as shown in FIG. 6, the blank 32 is acted upon by the dies 23 and 26 and the mandrel 29 to fill the cavity.

The lower part of the blank 32 is plastically deformed within the bore 33 of the weld ring 31 so that the part of the surface of the blank 32 which is in contact with the weld ring 31 is caused to move relative to the surface of the weld ring and because of the high pressure between the weld ring and the blank a surface layer is sheared from the bore 33 of the weld ring and the plastic deformation of the blank also causes removal of a surface layer from the part of the surface of the blank which contacts the weld ring thereby exposing new uncontaminated surfaces in contact with each other.

The thus formed assembly of body element and mounting part is then located in a graphite die with the mounting part in contact with the die and the heating operation performed as described hereinbefore.

This last described method has the advantage that the interface between the body element and mounting part comprises new uncontaminated surfaces, and also eliminates a separate assembly operation.

In all embodiments after the heating operation the assembly may be cold formed to a desired final configuration for example, a stud shape or cup shape and subsequently the semi-conductor is mounted on the body and a cover on the mounting part.

I claim:

1. A method of making a mount for a solid state semi-conductor comprising a mounting part secured to a body element comprising the steps of positioning a mounting part in contact with a body element, in a jig, the jig engaging the mounting part and having good thermal conductivity, subjecting the jig to a temperature above the melting point of the body element for a time to cause application of heat to the body element in the region of the interface between the body element and the mounting part by conduction of heat from the jig through the mounting part to the body element to raise the temperature of the region of the interface above its melting point to cause localized melting of the body element only in said region of the interface to cause fusion bonding of the mounting part of the body element and thereafter cooling the jig at a rate such that the remainder of the body element remains below its melting point.

2. A solid state semi-conductor mount when made by a method as claimed in claim 1.

3. A method according to claim 1 wherein the jig is adapted to engage the body element only in said region of localized melting to constrain deformation of the body element on the application of said heat.

4. A method according to claim 1 wherein the jig is made of graphite.

5. A method according to claim 1 wherein the jig is heated in a furnace.

6. A method according to claim 1 wherein the jig is provided with an integral heating means whereby the jig may be heated.

7. A method according to claim 1 wherein the interface is maintained at a temperature of not less than the melting point of the body element for approximately 1 minute.

8. A method according to claim 1 wherein the body element is in the form of a blank which is formed to a desired final configuration by a cold forming operation subsequent to bonding of the body element and mounting part.

9. A method according to claim 1 wherein the body element comprises a body of the desired final configuration.

10. A method according to claim 1 wherein a semi-conductor is mounted on the body and then a cover on the mounting part subsequent to bonding of the body element and mounting part.

11. A method according to claim 1 wherein the mounting part is positioned in contact with the body element by forming a spigot on the body element and assembling a ring shaped mounting part onto the spigot in the jig.

12. A method according to claim 1 wherein the mounting part is positioned in contact with the body element by positioning a blank for the body element adjacent to an opening in an annular mounting part, applying pressure to the blank to cause plastic deformation thereof to form the blank to a body element of predetermined configuration, said deformation including radially outward movement of part of the blank to bring the blank into contact with a planar surface of the surrounding mounting part, continuing the pressure against the blank and exerting pressure against the mounting part, the pressure being sufficient to shear off surface portions of the blank and mounting part thereby exposing new uncontaminated surfaces in contact with each other.

13. A method according to claim 1 wherein the mounting part is positioned in contact with the body element by assembling the body element and mounting part in face to face contact in the jig.

* * * * *